United States Patent
Rin et al.

(10) Patent No.: US 12,046,458 B2
(45) Date of Patent: Jul. 23, 2024

(54) MULTI-ZONE HEATING APPARATUS, BOTTOM ELECTRODE ASSEMBLY, PLASMA PROCESSING APPARATUS, AND TEMPERATURE ADJUSTING METHOD

(71) Applicant: ADVANCED MICRO-FABRICATION EQUIPMENT INC. CHINA, Shanghai (CN)

(72) Inventors: Sha Rin, Shanghai (CN); Jie Du, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 327 days.

(21) Appl. No.: 17/521,778

(22) Filed: Nov. 8, 2021

(65) Prior Publication Data
US 2022/0148859 A1 May 12, 2022

(30) Foreign Application Priority Data
Nov. 11, 2020 (CN) .......................... 202011253024.X (51) Int. Cl.
*H01J 37/32* (2006.01)
(52) U.S. Cl.
CPC .. *H01J 37/32724* (2013.01); *H01J 37/32568* (2013.01); *H01J 2237/002* (2013.01); *H01J 2237/2007* (2013.01)

(58) Field of Classification Search
CPC .......... H01J 37/32724; H01J 37/32568; H01J 2237/002
See application file for complete search history.

(56) References Cited

U.S. PATENT DOCUMENTS

| | | | |
|---|---|---|---|
| 2017/0167790 A1* | 6/2017 | Gaff | H05B 3/0014 |
| 2018/0040496 A1* | 2/2018 | Lee | H01L 21/67248 |
| 2019/0153598 A1* | 5/2019 | Ptasienski | C23C 16/4586 |
| 2020/0027706 A1* | 1/2020 | Jing | H01L 21/67248 |

\* cited by examiner

*Primary Examiner* — Scott Bauer
(74) *Attorney, Agent, or Firm* — WOMBLE BOND DICKINSON (US) LLP; Joseph Bach, Esq.

(57) ABSTRACT

Disclosed are a multi-zone heating apparatus, a bottom electrode assembly, a plasma processing apparatus, and a temperature adjusting method, wherein the multi-zone heating apparatus includes: a plurality of foil heaters; a plurality of switches, each switch being connected with a foil heater to form a heating unit; two ends of the plurality of heating units are connected to a ground bus and a power supply bus, respectively; a plurality of driving wires, each driving wire being connected with a switch and configured to transmit a control signal of the duty cycle of the switch, the switches being configured to independently control the operating time of the connected foil heaters based on the control signal. The multi-zone heating apparatus can be integrated between the electrostatic chuck and the base in the plasma processing apparatus and can reduce use of external conductive wires, thereby reducing the demand for filters.

24 Claims, 6 Drawing Sheets

MULTI-ZONE HEATING APPARATUS, BOTTOM ELECTRODE ASSEMBLY, PLASMA PROCESSING APPARATUS, AND TEMPERATURE ADJUSTING METHOD

RELATED APPLICATIONS

The present application claims priority to and the benefit of Chinese Patent Application No. 202011253024.X, filed on Nov. 11, 2020, and the disclosure of which is hereby incorporated by reference in its entirety.

FIELD

Embodiments of the present disclosure relate to thermal processing, and more particularly relate to a multi-zone heating technology.

BACKGROUND

Multi-zone temperature control technologies are widely applied in various technical fields, e.g., chemical industry, biology, pharmaceutical industry, and integrated circuits (IC). Particularly, in the IC manufacturing field, with decrease of the critical dimension in semiconductor device manufacturing and increase of wafer size, there poses an increasingly high demand on temperature control precision and multi-zone control for wafer processing.

Semiconductor manufacturing process in IC manufacturing includes: chemical vapor deposition (CVD) process and plasma processing, etc. The plasma processing is mainly applied in wafer etch processing. The principle of plasma processing includes: applying a radio frequency (RF) power source to activate a plasma processing apparatus to generate a relatively strong high-frequency alternating electromagnetic field to ionize a low-pressure process gas to generate plasma. The plasma includes a large number of active particles such as electrons, ions, excited atoms, molecules, and free radicals, wherein the active particles may undergo a variety of physical and chemical reactions with the wafer surface so as to transform the profile of wafer surface, thereby completing the plasma processing. As temperature is an important factor affecting the performance of wafer processing, a plurality of ring-shaped heating zones is conventionally arranged to perform individual temperature control so as to satisfy temperature uniformity demands. With evolution of the processing techniques, the critical dimension becomes increasingly smaller, posing an increasingly high demand on temperature uniformity. However, due to the large area of independently controllable heating zones, the conventional technologies cannot effectively solve the issue of local temperature non-uniformity in very small zones on the wafer, which leads to a plurality of abnormal temperature sites on the wafer; as such, the wafer processing performance on corresponding abnormal temperature sites cannot be guaranteed, finally deteriorating the wafer processing efficiency.

Therefore, a novel multi-zone temperature control heater is desired for a plasma processing apparatus, wherein the multi-zone temperature control heater can be integrated in a RF environment of the process chamber, particularly integrated between an electrostatic chuck and a base, and most preferably, can reduce externally coupled conductive wires to thereby reduce use of filters.

SUMMARY

In view of the above, the present disclosure provides a multi-zone heating apparatus, a bottom electrode assembly, a plasma processing apparatus, and a temperature adjusting method, so as to solve the technical problems in conventional technologies and enhance performance of the semiconductor processing apparatus.

To achieve the objectives above, the present disclosure adopts the following technical solution:

The present disclosure provides a multi-zone heating apparatus, comprising: a plurality of foil heaters; a plurality of switches, wherein each switch is connected with one foil heater to form a heating unit; a ground bus and a power supply bus, which are connected to two ends of each of the plurality of heating units, respectively; a plurality of driving wires, each being connected with one switch and configured to transmit a driving signal indicating duty cycle of the switch, such that the switch independently control operating time of the connected foil heater based on the control signal.

Optionally, the multi-zone heating apparatus further comprises at least one driver, the driver transmitting the driving signals to the switches via the driving wires.

Optionally, the multi-zone heating apparatus further comprises a control bus, the control bus outputting a control signal to the at least one driver, the control signal including coordinate and adjustment range information of the heating unit subjected to temperature adjustment.

Optionally, the driver is configured to identify the control signal outputted by the control bus and transmit the driving signal of adjustment to the corresponding switch, wherein the driver includes at least one of a latch, a small CPU, a memory, or a comparator.

Optionally, the number of the drivers is less than or equal to that of the switches.

Optionally, current flowing through the switches is less than or equal to 100 mA. Optionally, the plurality of foil heaters form a heating layer, a plurality of the foil heaters in the heating layer being arranged in an array, at least two foil heaters being disposed in a same horizontal plane.

Optionally, the plurality of switches form a switch layer, the switch layer being disposed above or below the heating layer or disposed in the same plane as the heating layer.

Correspondingly, the present disclosure further provides a bottom electrode assembly, comprising: a base and an electrostatic chuck, the multi-zone heating apparatus being provided between the base and the electrostatic chuck.

Optionally, a coolant channel is provided in the base, the driving wire bypassing the coolant channel and passing through the base.

Correspondingly, the present disclosure further provides a plasma processing apparatus, comprising: a plasma process chamber in which the bottom electrode assembly is provided, wherein the multi-zone heating apparatus of the bottom electrode assembly is configured to perform multi-zone temperature adjustment to a wafer held by the electrostatic chuck.

Optionally, the ground bus and the power supply bus are connected to a non-RF hot space via one filter.

Optionally, the number of heating units of the multi-zone heating apparatus is greater than or equal to 100.

Optionally, the multi-zone heating apparatus comprises a drive control device, the drive control device including the plurality of switches and at least one driver, wherein the driver being configured to identify and store a control signal transmitted from the control bus and determines whether to adjust duty cycle of the switch controlled thereby based on indications in the control signal.

Optionally, the driver is disposed beneath the base, and a plurality of coolant channels are provided in the base, wherein the driving wire is arranged to bypass the coolant channel and pass through the base.

Optionally, a facility plate is further provided beneath the base, the driver being disposed between the base and the facility plate.

Optionally, the multi-zone heating apparatus further comprises a bridging layer, the bridging layer being disposed above the base and configured to arrange the driving wires to the plurality of switches.

Optionally, the at least one driver is disposed above the base, a bonding layer is provided between the base and the plurality of foil heaters, and the drive control device is disposed in the bonding layer or in a recessed portion of the upper surface of the base.

Optionally, the ground bus is connected with a plurality of ground bus branches, and the power supply bus is connected with a plurality of power supply bus branches, wherein the heating units have one end connected with the ground bus via the power supply bus branches and the other end connected with the power supply bus via the power supply bus branch.

Optionally, the ground bus branches and the power supply bus branches are disposed in a same horizontal plane or different horizontal planes.

Optionally, the ground bus branches and the power supply bus branches form an interconnect layer, a plurality of the foil heaters form a heating layer, and a plurality of the switches form a switch layer, wherein the interconnect layer is disposed between the heating layer and the switch layer, or disposed beneath the switch layer, or disposed above the heating layer.

Optionally, the interconnect layer includes a bus interconnect network, the bus interconnect network including a plurality of wires extending upwards or downwards, the wires being connected to the switches or the foil heaters, respectively.

Optionally, a bridging layer is further provided between the foil heaters and the base; the bridging layer includes at least part of a plurality of driving wires, the upper surface of the bridging layer including output ends of the plurality of driving wires, positions of the plurality of output ends corresponding to the switches above.

Optionally, the plasma processing apparatus includes a controller, the controller being located in a non-RF hot space, a control signal outputted by the controller being transmitted to the driver via the control bus.

Optionally, the controller transmits, via an optical fiber, an optical control signal to a photoelectric conversion device in the plasma process chamber, the photoelectric conversion device outputting an electric control signal to the control bus.

Optionally, the control bus is connected with the controller via a filter.

Optionally, the driving signal is a pulsed signal. The pulsed signal enables each switch to cyclically switch between ON and OFF states, and heating power of the foil heaters is adjusted based on the time intervals of high and low levels in each pulse period.

Optionally, a modulation circuit is provided between the driver and the switches, for dividing one ON pulse of the driving signal into a plurality of mutually isolated ON pulses.

Optionally, a main heater is further provided between the base and the electrostatic chuck, the main heater being disposed beneath the heating layer.

Correspondingly, the present disclosure further provides a method for multi-zone temperature adjustment, comprising:

transmitting, by the control bus, a preset control signal to the driver based on process temperature requirements, wherein the driver transmits a received control signal to the switch connected thereto and controls duty cycle of the switch, and the switch controls the foil heater to heat within the operating time of the duty cycle; when the control bus is to adjust the heating power of a foil heater, outputting, by the control bus, a control signal carrying a heating coordinate signal and the target heating power value, wherein the driver receives and identifies the control signal to determine whether it is needed to adjust the output power; wherein the driver which determines a need to adjust the output power changes the control signal outputted to the corresponding switch, and the corresponding switch adjusts its own operating time intervals based on the control signal so as to adjust the heating power of its corresponding foil heater.

Optionally, the driving signal is a pulsed signal, the pulsed signal enabling each switch to cyclically switch between ON and OFF states, wherein duty cycles of different switches are not exactly identical.

Optionally, driving signal phases outputted by the driver to different switches are not exactly identical.

Optionally, the driver which determines no need to output power adjustment maintains the current outputted driving signal.

Optionally, the controller sets a plurality of heating units as one temperature control unit based on input parameters, and the plurality of heating units in each temperature control unit, after receiving the driving signal, synchronously change their output powers.

Compared with the prior art, the technical solutions in the embodiments of the present disclosure offer the following beneficial effects:

In the multi-zone heating apparatus provided by the present disclosure, one switch and one foil heater form one heating unit, the switch in each heating unit being connected with one driving wire, the driving wire being configured to control the duty cycle of the switch to control the heating power of the foil heater. In the present disclosure, the rated current of the switches adopted by the present disclosure is relatively small, such that the corresponding size can be made very small; therefore, the switches can be integrated between the electrostatic chuck and the base in the plasma processing apparatus. Moreover, two ends of the heating unit are connected to the ground bus and the power supply bus, respectively; therefore, the drive control circuit of the multi-zone heater only needs three external wires, i.e., the power supply bus, the ground bus, and the control bus connected to the driving wire. As such, RF signal isolation between the heater circuit and the external circuit can be realized with only three filers. Even the control bus may be replaced with an optical fiber, such that for the heaters of independent heating zones (irrespective of the number of the independent heating zones), drive control can be realized with only two external wires and two filters. In view of the above, the multi-zone heating apparatus can be integrated between the electrostatic chuck and the base of the plasma processing apparatus so as to reduce use of external conductive wires, thereby reducing the demand for filters.

BRIEF DESCRIPTION OF THE SEVERAL VIEWS OF THE DRAWINGS

To elucidate the technical solutions of the present disclosure, the drawings used for describing the embodiments will be briefly introduced below. The drawings as described only relate to some embodiments of the present disclosure. To those skilled in the art, other drawings may be derived based on the drawings provided by the present disclosure without exercise of inventive work, wherein.

DETAILED DESCRIPTION

Hereinafter, the technical solution of the present disclosure will be described in a clear and comprehensive manner with reference to the preferred embodiments in conjunction with accompanying drawings; it is apparent that the embodiments described here are only part of the embodiments of the present disclosure, not all of them. All other embodiments obtained by those skilled in the art without exercise of inventive work based on the examples in the embodiments all fall within the protection scope of the present disclosure.

The present disclosure discloses a multi-zone heating apparatus. The multi-zone heating apparatus may be applied to the scenarios where multi-zone accurate temperature control is desired, including, but not limited to, biology, pharmaceutical industry, chemical industry, and integrated circuit, etc.

Figure 1:
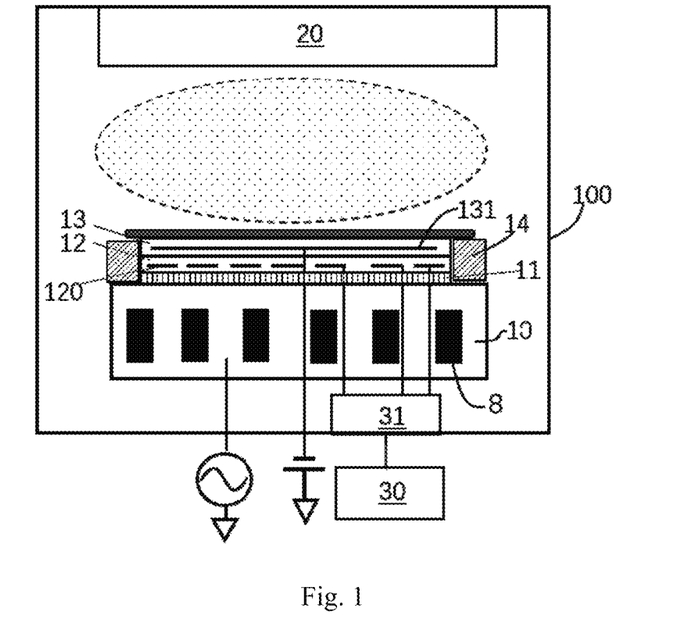
FIG. 1 is a structural schematic diagram of a plasma processing apparatus according to the present disclosure.

FIG. 1 shows a schematic diagram of a plasma processing apparatus. The plasma processing apparatus comprises a process chamber 100, a gas inlet device 20 provided on the inner top of the process chamber 100, and a conductive base 10 provided in the inner bottom of the process chamber 100, wherein the conductive base 10 is connected to at least one RF source via a cable so as to ignite plasmas disposed above. In the conductive base 10, there provides a coolant circulation channel which is in communication with an external cooler to control the base to operate under a stable temperature. Above the conductive base 10, there is sequentially arranged a bonding layer 11, a heater 12, and an electrostatic chuck 13. The electrostatic chuck 13 has an electrode 131, the electrode 13, which is connected to an external high-voltage DC power supply via a wire, being configured to attract the wafer disposed on the electrostatic chuck 13. A plurality of foil heaters 120 are provided in the heater 12, wherein each foil heater 120 is configured to heat the region above itself. The foil heaters 120 are connected to a heating power supply 30 in a non-RF hot space via at least one filter 31.

Figure 2:
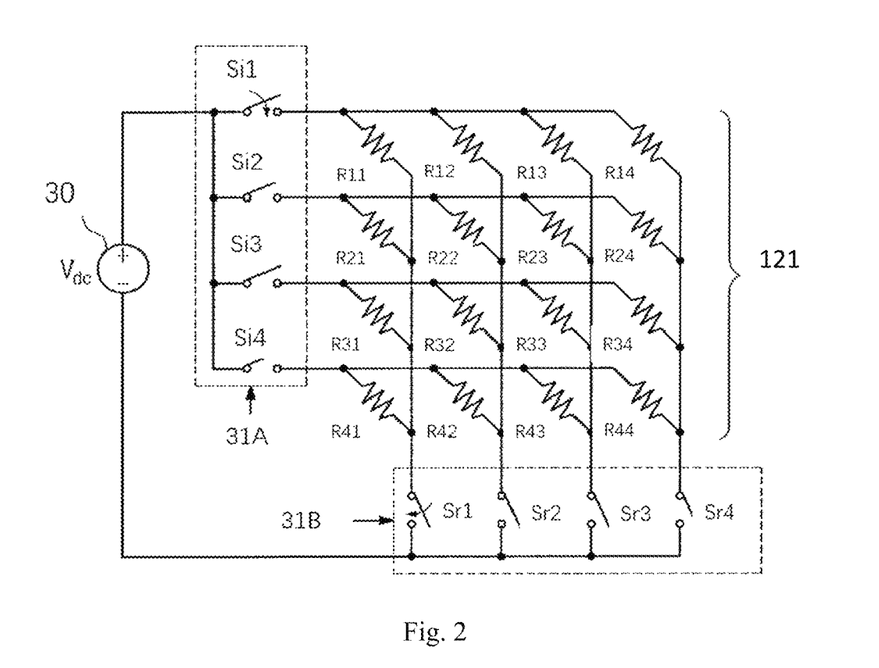
FIG. 2 is a structural schematic diagram of a time-division multiplexing heater.
Figure 3:
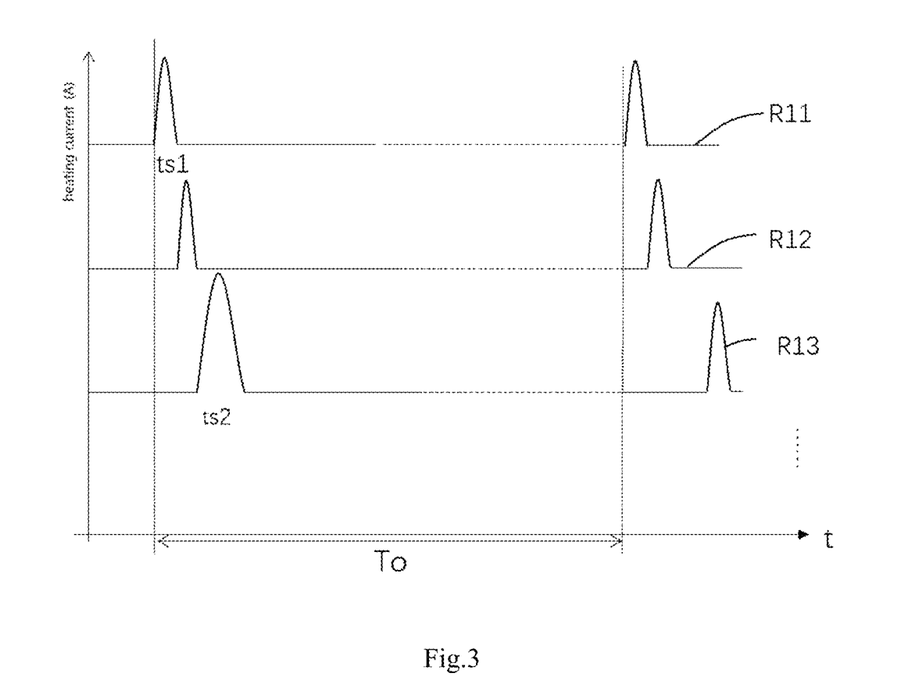
FIG. 3 is a schematic diagram of time distribution of heating current of the time-division multiplexing heater.

FIG. 2 illustrates a schematic diagram of a multi-zone heating apparatus. The heater matrix 121 exemplarily illustrated as having a plurality of foil heaters R11-R44 arranged in a 4*4 matrix, wherein a plurality of power supply switches in the power supply switch group 31A are respectively connected to each row of foil heaters 120 (see FIG. 1), and a plurality of ground switches in the ground switch group 31B are respectively connected to each column of foil heaters 120 (see FIG. 1). The 4*4 matrix is only a simplified illustration of the operating manner of the multi-zone heating apparatus. In actuality, the foil heaters may be extended to 6*6 or more foil heaters as needed. In the foil heater matrix shown in FIG. 2, the foil heaters 120 in the first row of the 4 rows are connected to one power supply switch Si1 via a common wire and then selectively connected to the heating power supply 30; likewise, the second to fourth rows of foil heaters 120 are connected, via their own wires, to the power supply switches Si2 to Si4 and then selectively connected to the heating power supply 30. On the other hand, the foil heaters in each column are connected, via their respective common ground wires, to the ground switches Sr1 to Sr4 and then connected to the ground end via the ground switches Sr1 to Sr4, finally forming a loop. During the operating process, by selectively conducting one power supply switch and one ground switch, the controller enables one foil heater 120 at the corresponding position to be heated, finally performing temperature control to the entire heater via point-by-point scanning. In this embodiment, given that the heating time of each foil heater 120 is ts, as only one foil heater 120 is heated at a time, the time for completing an entire scanning for the heater is T0=16*ts. FIG. 3 illustrates heating currents of the foil heaters R11, R12, R13, wherein to maintain the current temperature, R11 and R12 both wait for an interval period T0 for next inflow of a heating current with the same pulse width ts1, and for R13 which needs a temperature rise, its heating time width will reach ts2.

Figure 4:
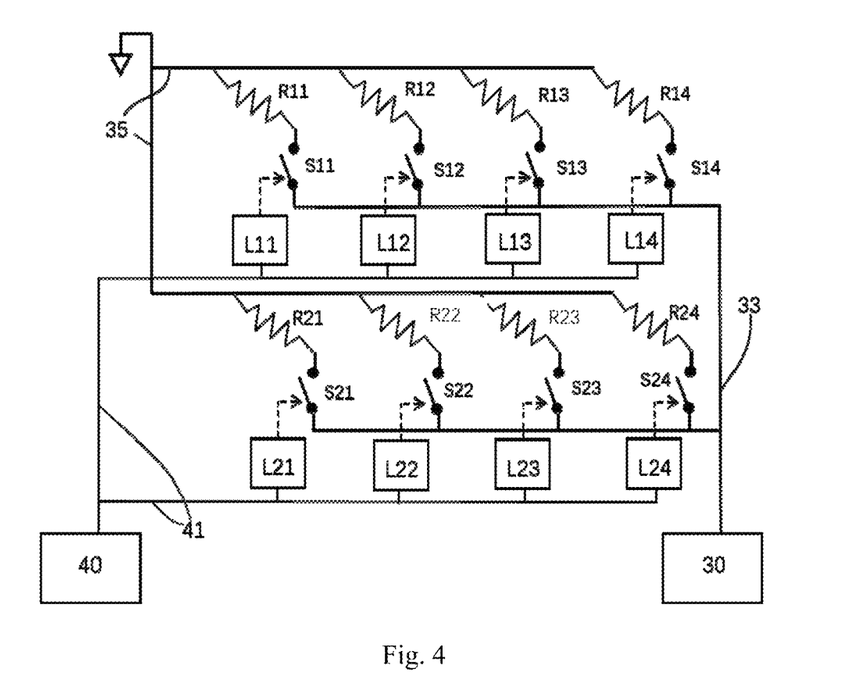
FIG. 4 is a structural schematic diagram of circuitry structure of a multi-zone temperature heater.

With such matrix layout of the foil heaters, the time-division multiplexing pulse heating method can significantly reduce the number of external power supply wires and ground wires, where a 10*10 matrix, which may independently heat 100 zones, only needs 20 (10+10) filters and switches to realize drive. However, a heater with such a structure has some drawbacks: for a matrix with an enormous number of foil heaters, the effective heating time (ts) of each foil heater is actually very short, and after long-time waiting (T0), the temperature has already dropped; therefore, it cannot satisfy the need of a large temperature rise. Even for the sake of maintaining the current temperature, there still requires a very large current within the heating time interval ts to produce enough heat within the short time; otherwise, the average heating capacity within one heating period T0 will be too slow to maintain the current temperature. This requires that each power supply switch and ground switch have a capacity of transmitting a large current within a short time, which is highly demanding on the size and material of the switches; however, such switches cannot be integrated in a heating layer 22 with a thickness of only several millimeters, and thus can only be provided external to the process chamber FIG. 4 shows a circuitry structural schematic diagram of a multi-zone temperature control heater according to the present disclosure. The multi-zone temperature control heater in this embodiment includes foil heaters (R11~R24) arranged in matrixes. The 2*4 matrix in the figure as illustration is only for explaining the circuitry structure of the multi-zone heater according to the present disclosure, wherein the number of foil heaters in the matrix may be far more than 8, e.g., more than 150, even more than 200, or even over 400. The spatial layout may also be freely selected based on actual needs. In this embodiment, each foil heater is connected to a switch to form a heating unit; two ends of a plurality of the heating units are connected to one ground bus and one power supply bus via ground bus branches and power supply branches, respectively. Specifically, in the embodiment shown in FIG. 4, the four foil heaters (R11~R14) in the first row having one end connected to the ground bus 35 via the ground bus branches to realize one end grounded; meanwhile, the four heaters having the other end respectively connected to one end of the switches (S11~S14), while the other end of the four switches are respectively connected to the power supply bus 33 via the power supply bus branches, the power supply bus 33 being connected to the heating power supply 30. Meanwhile, the four foil heaters in the second row (R21~R24) have one end connected to the ground end via another branch of the ground bus 35, and meanwhile, the four foil heaters have the other end connected to another branch of the power supply bus 33 via the switches (S21~S24) corresponding to the respective foil heaters. In alternative embodiments, the power supply bus 33 and the ground bus 35 may have more branches, and each branch has the same voltage. Therefore, irrespective of how many heating units there exist, all of the first ends of these heating units are connected to one common ground bus, while all of the second ends of the heating units are connected to one common power supply bus.

In the present disclosure, latches L11~L24 corresponding to respective switches are further provided for the heater. These latches are connected to one common control bus 41 so as to be connected to the controller 40 via the control bus 41 and receive a control signal from the controller 40. The control signal includes coordinate information of a heating unit subjected to output power adjustment as well as target heating power value of the heating unit at the coordinate. Meanwhile, each latch outputs a driving signal to the connected switch, wherein the driving signal is configured to control operating time interval of the switch in each cycle, i.e., duty cycle, so as to control heating power of the foil heater. Each latch controls the heating power of the foil heater by controlling the duty cycle of the connected switch based on a preset heating power signal, and meanwhile determines whether to change the currently outputted driving signal based on the received control signal. If the control signal received by the latch L11 under the coordinate 11 does not instruct the heater R11 to change heating power, the latch L11 maintains the original driving signal to the switch S11; if the control signal received by the latch L11 requires power adjustment to the heater R11, the latch L11 correspondingly adjusts the outputted driving signal based on the control signal, wherein the control signal controls the duty cycle of the switch S11 to adjust the heating power inputted to the heater R11.

Figure 5:
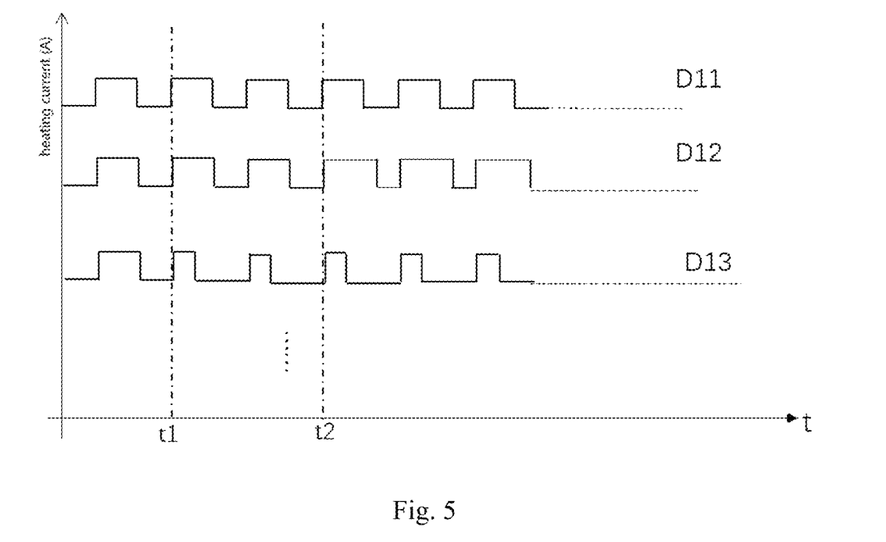
FIG. 5 is a schematic diagram of time distribution of the heater current according to an embodiment of the present disclosure.

FIG. 5 exemplarily illustrates changing waveforms of driving signals D11, D12, and D13 of the switches S11, S12, and S13. The three driving signals from the beginning to time t1 all have an initial duty cycle 50%; at time t1, the control signal received by the latch L13 includes information which requires reducing the heating power of the heater R13; then, the latch L13 modifies the driving signal D13, such that the duty cycle of the switch S13 changes to 25%. Meanwhile, the latches L11 and L12 identify the received control signal and find no information requiring output power modification to the heaters R11 and R12; therefore, the latches L11 and L12 still maintain the original driving signals. After operating for a period of time, the temperature sensing system detects a new abnormal temperature site; therefore, at time t2, a new control signal is broadcast again to all latches via the control bus 41; the latch L12 identifies the information requiring increase of the heating power of the foil heater R12; after processing, the adjusted driving signal D12 is outputted to the switch S12; the adjusted driving signal D12 controls the switch S12 to realize a 70% duty cycle so as to satisfy temperature adjustment for the local zone.

Each switch performs switching between ON and OFF states based on the received driving signal, wherein when the switch is ON, the foil heater is connected to the heating power supply 33 so as to be heated, and when the switch is OFF, the foil heater stops heating. The heating current of each foil heater has the same waveform as the driving signal outputted to the corresponding switch. The higher the duty cycle of the switch in the driving signal, the longer the heating time of the corresponding foil heater; the higher the heating power, the lower the duty cycle of the switch, and correspondingly, the lower the heating power of the corresponding foil heater.

The driving signal may be outputted to the switch after being further modulated by a modulation circuit, wherein the modulation circuit may optionally divide an ON pulse in the driving signal into a plurality of mutually isolated ON pulses. For example, the pulse signal of 50% duty cycle is divided into two short pulses of 25% cycle length, or five short pulses of 10% cycle length, or two pulses of 20% cycle length and one pulse of 10% cycle. Such modulated multi-segment short pulse heating method offers the following technical effects: in the long ON time of the first half cycle, the continuous heating will not cause the foil heater above to have a too fast temperature rise, while in the second half cycle, the foil heater will not have a too fast temperature drop, thereby guaranteeing a stable temperature for various zones of the wafer above the corresponding heating unit. After modulation, since the heating period is partitioned into a plurality of segments, temperature fluctuation of the foil heater is significantly reduced. Therefore, the pulse frequency of each latch for refreshing the power output status may be selected lower, e.g., less than 10 Hz. The modulation circuit may optionally stagger the phases of the driving signals outputted by different latches, such that even there are a large number of switches, the switches will not be simultaneously conducted, avoiding a too large instantaneous output current on the power supply bus, such that the heating current is uniformly distributed within a long period.

The above description provides insights on the operating process of the drive control system comprising controllers, latches, and switches of the present disclosure, wherein the ON time of each switch is only controlled by the duty cycle of the driving signal. With a 50% duty cycle as an example, the switch always has an in-flow heating current in 50% time of each cycle; likewise, to output a heating power of several watts, the maximum in-flow current may only have several or dozens of milliamperes, e.g., less than 100 milliamperes. In the embodiments illustrated in FIG. 2 and FIG. 3, each foil heater inputs current only in one pulse segment of one cyclic period (T0), and in most of the time, they wait for switching of other switches; therefore, to reach the same heating power, a very high current (e.g., greater than 1 ampere) must be input in a very short time; therefore, the switch must withstand a large in-flow current and a high voltage. However, such large-power devices have a too large size and a too high cost and thus cannot be integrated into a thin-sheet electrical heater 12. In the present disclosure, since the switches have a significantly reduced rated current and a correspondingly miniaturized size, they can be integrated into the heater 12.

In the present disclosure, all heating units have one end connected to one ground bus and the other end connected to one power supply bus, and all switches are serially connected between the foil heater and the ground bus or between the heater and the power supply bus. Each switch is drive controlled via the driving signal outputted by the corresponding latch. All latches receive a control signal from the control bus to perform control. In the present disclosure, the multi-zone heater drive control circuit only requires three external wires, i.e., a power supply bus, a ground bus, and a control bus; therefore, there only needs three filters to realize RF signal isolation between the heater circuit and the external circuit. Even the control bus may be replaced with an optical fiber, such that the photoelectrical conversion device provided in the heater or the base converts the driving signal to an electrical signal to perform the subsequent control drive. As such, for the heaters of independent heating zones, irrespective of the number of the independent heating zones, drive control can be realized with only two filters. However, the conventional technologies need dozens of external conductive wires (i.e., dozens of filters) to implement the functions that can be implemented by the present disclosure with only two filters. The present disclosure may flexibly realize increase and decrease of the number of heating units. Compared with the circuit structures in conventional technologies in which the number of wires increases with the number of independently controlled foil heaters, this embodiment does not need much hardware modification to the base and the electrostatic chuck. In conventional technologies, as the base structure is relatively fixed, their hardware cannot be modified to be adapted to a varying number of lead wires. However, the heater manufactured according to the idea of the present disclosure has a strong adaptability, which is adaptable to the needs of various processes by simple modifications.

Apart from requiring significant temperature rise of all or most of the foil heaters in the matrix at initial establishment of a preliminary temperature distribution, it is also enabled to perform a subsequent heating or cooling operation only on the heating unit at the position corresponding to a detected abnormal temperature point (relative to the temperature lower point or higher point in other zones) so as to compensate for temperature non-uniformity. Upon temperature difference compensation, the controller may only transmit the coordinate of the foil heater in the zone corresponding to the abnormal temperature point, as well as the target power of the foil heater, to the corresponding latch, such that the latch, after reading the control signal, outputs the corresponding driving signal.

Figure 6A:
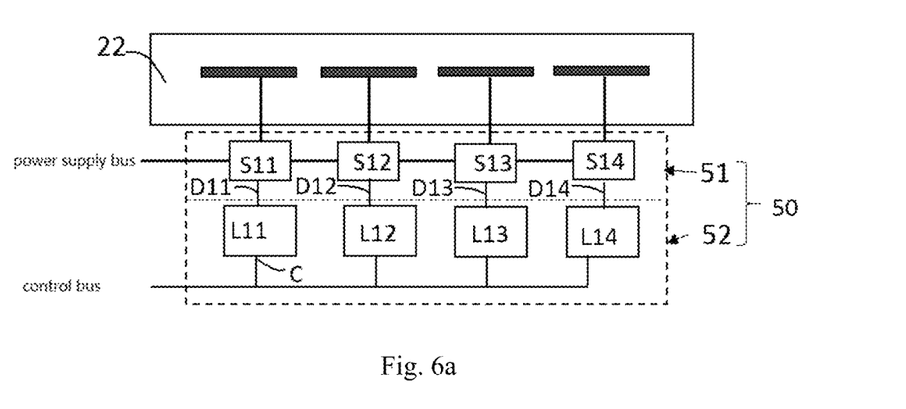
FIG. 6a is a structural schematic diagram of spatial layout of a multi-zone temperature control heater according to an embodiment of the present disclosure.
Figure 6B:
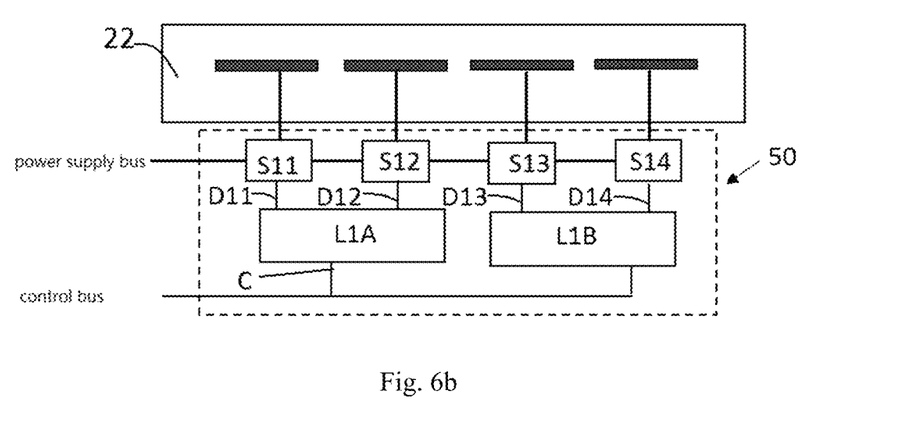
FIG. 6b is a structural schematic diagram of spatial arrangement of another multi-zone temperature control heater according to an embodiment of the present disclosure.
Figure 7:
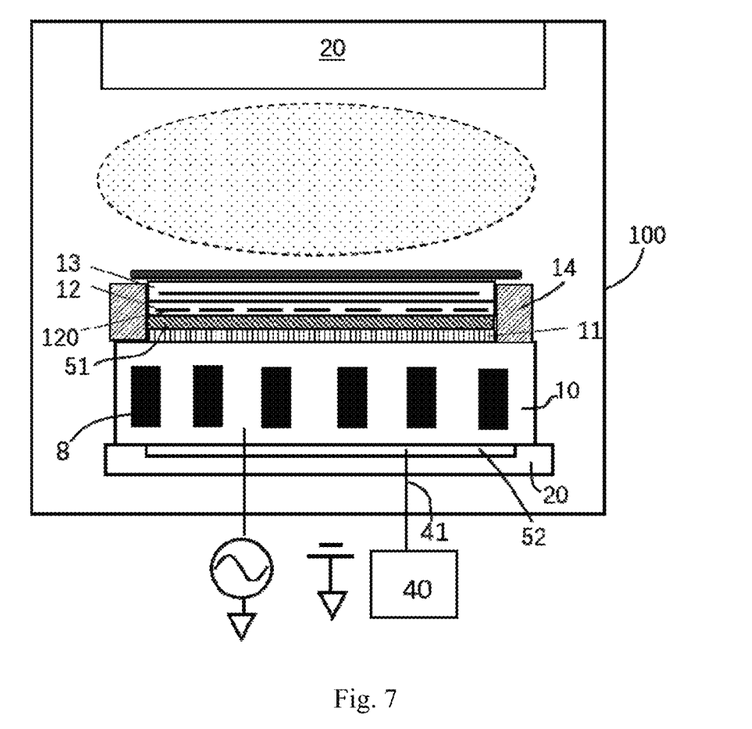
FIG. 7 is a schematic diagram of another embodiment of a plasma processing apparatus according to the present disclosure.

As illustrated in FIG. 6a, each latch may be configured to drive a switch; or, as illustrated in FIG. 6b, one latch is configured to drive a plurality of switches. In FIG. 6a, the power supply bus is connected to respective independent foil heaters in the heater 12 via the switches S11~S14, and the control bus is connected to the latches L11~L14 and outputs a control signal C to respective latches. The latches L11~L14 output the driving signals D11~D14 to the switches S11~S14, respectively. The switch array and the latch array form a drive control device 50, wherein the drive control device 50 may be buried in the heater 12 or provided in the bonding layer 11 or the base 10. Optionally, the drive control device 50 is disposed beneath the heater 12 and proximal to the base where temperature is controlled by coolant liquid so as to maintain the temperature at a stable low temperature, ensuring that a large number of semiconductor switches and logic circuits in the heater drive control device 50 will not suffer performance deterioration or even failure due to overheat. The stacking relationships in FIGS. 6a and 6b are only exemplarily illustrated; however, in actuality, the latch array may be disposed above the switch array or in the same material layer. FIG. 6b is a spatial layout structural schematic diagram of another multi-zone temperature control heater provided by an embodiment of the present disclosure, the main structure of which is similar to FIG. 6a, except that the latch L1A, after being connected to the control bus, outputs two driving signals D11, D12 to different switches S11, S12, and the latch L1B, after being connected to the control bus, outputs two driving signals D13, D14 to different switches S13, S14. Likewise, it is also a varied embodiment of the present disclosure that one latch simultaneously drives three or more switches.

Figure 8:
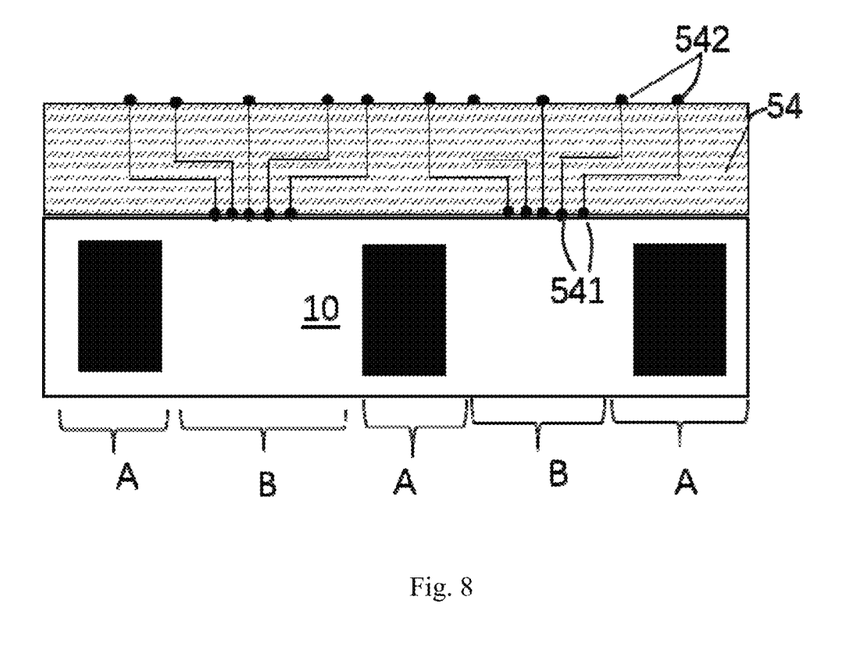
FIG. 8 is a schematic diagram of the in-bridging layer structure and the position of the base according to the present disclosure.

In an embodiment of the present disclosure, the heater drive control device 50 may be separated into two layers, as shown in FIG. 6a, wherein the switch layer 51 is disposed above, and the latch layer 52 is disposed below. The switch layer 51 includes a large number of switches as described above. Since the switches are configured to conduct a large current to perform heating, the switches for these discrete devices can withstand higher voltage and temperature fluctuation. The latch layer includes a large number of latches. Since each latch includes a large number of microelectronics, it has a relatively low temperature resistance capacity and is easily damaged by an instantaneous large current caused by arcing discharge generated in the process chamber. Therefore, the latch layer 52 should be disposed as distant as possible from the plasma heat source above as well as distant from the charge accumulation zone above. To further guarantee stable operation of the latch layer 52, the present disclosure may arrange the latch layer 52 in the gap below the base 10 and above the facilitate plate 20. In the latch layer 52, the large number of latches have one end connected to the control bus to receive control signals and the other end accessing the switch layer 51 above via a plurality of driving wires passing through the small through-holes provided in the base. As the base has a coolant channel 8, the through-holes need to bypass these coolant channels, passing through the areas of conductive materials between the coolant channels 8 to form passages. Since the positions of these driving wires are related to the shape of the coolant channels, after the driving wires pass through the base to access the upper surface of the base, a bridging layer may be provided, such that these driving wires extend till their respective corresponding switch positions along a horizontal direction. FIG. 8 shows a basic structure of the bridging layer 54. The bridging layer 54 is disposed above the base 10, wherein the area corresponding to the coolant channels is referred to as area A, while the area between the coolant channels is referred to as area B. In the present disclosure, the driving wires can pass through area B to access the upper surface of the base. The bottom side of the bridging layer 54 includes a plurality of input ends 541 which are located in area B of the base; however, the foil heaters above are arranged into a matrix uniformly distributed in the whole plane. Therefore, it is needed to bridge the input ends concentrated in area B to the positions corresponding to the foil heaters or switches above. Therefore, in the bridging layer 54, the bottom side has a plurality of input ends 541 disposed in the area between the coolant channels, and the upper surface of the bridging layer has a plurality of output ends 542 exactly corresponding to the switch positions; between the two end points, there further include wires extending horizontally, or vertically, or obliquely, thereby realizing interconnect between the input ends and the output ends. For example, the driving wire corresponding to the latch L44 under the coordinate 44, after accessing the base, extends a distance horizontally to reach the switch S44; finally, the switch S44 drives the foil heater R44 above to perform heating power control with respect to the foil heater R44.

Figure 9A:
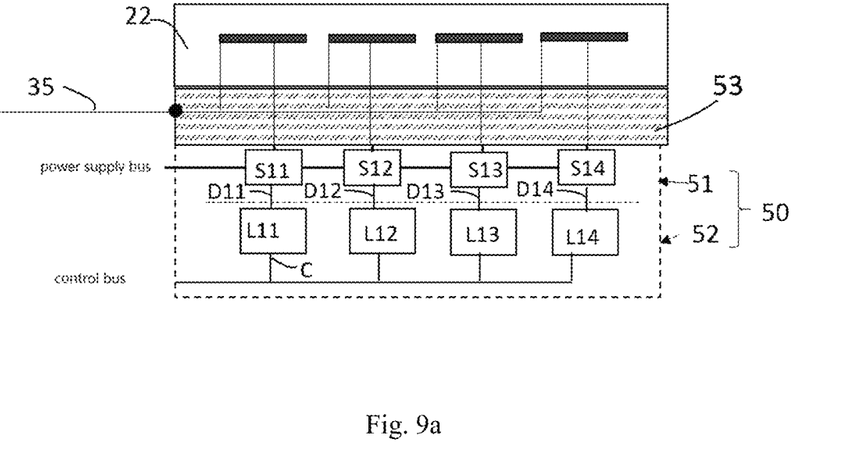
FIG. 9a is a schematic diagram of a stacked structure of an interconnect layer in the heater according to the present disclosure.
Figure 9B:
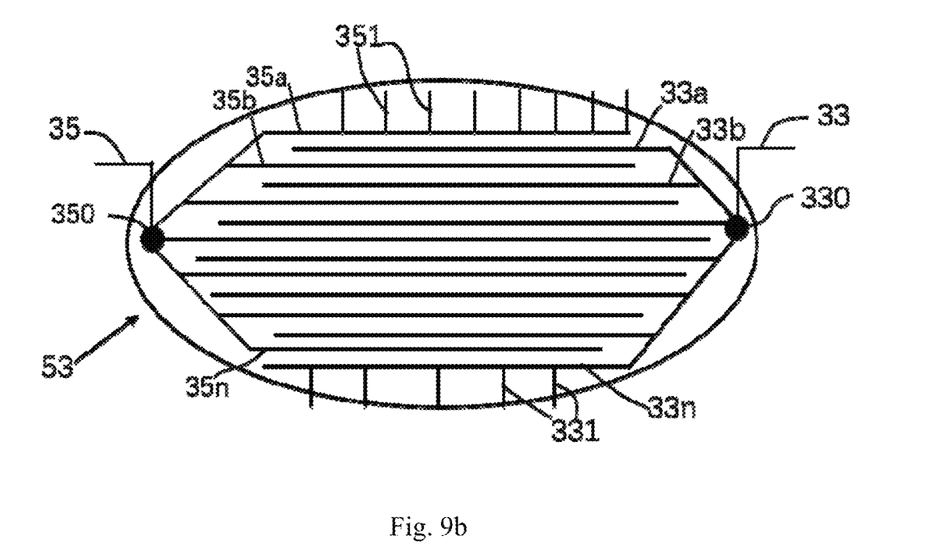
FIG. 9b is a structural schematic diagram of a power supply bus in the interconnect layer according to the present disclosure.

Besides the bridging layer, the present disclosure may further provide an interconnect layer configured for the power supply bus and the ground bus to extend horizontally to implement connection of the large number of foil heaters with the power supply bus and the ground bus. As illustrated in FIG. 9a, the interconnect layer 53 is disposed between the switch layer 51 and the heating layer 22 formed by a plurality of foil heaters. One ground bus 35 is connected to the interconnect layer and substantially extends in the horizontal direction, and a plurality of upward extending ground bus branches of the ground bus 35 are connected to the first ends of the plurality of foil heaters, realizing grounding of the plurality of foil heaters. Meanwhile, the power supply bus is connected to the switch layer so as to be electrically connected to a plurality of switches, wherein the heating powers outputted by the plurality of switches pass through the interconnect layer 53 via power output lines to be connected to the second ends of the foil heaters, thereby realizing control of the heating power of each foil heater. FIG. 9b shows another embodiment of the interconnect layer of the present disclosure, wherein the power supply bus 33 is also integrated into the interconnect layer 53. The ground bus 35 includes a plurality of ground bus branches 35a-35n, and the power supply bus 33 includes a plurality of power supply bus branches 33a-33n, wherein the plurality of ground bus branches and the plurality of power supply buses are substantially uniformly distributed in the ring-shaped plane above the base. The ground bus branches include a plurality of upward extending wires 351 to pass upward through the heater layer 22 to implement connection with each foil heater. The power supply bus branches include a plurality of downward extending wires 331 to implement connection to the respective switches in the switch layer below. The switches, after being selectively switched ON or OFF to perform pulse width modulation (PWM) to the incoming power lines of the power supply bus, pass upward through the interconnect layer 53 via power output lines to reach the second ends of respective foil heaters in the heating layer 22. In an alternative embodiment, the power supply bus may be connected to one ends of the foil heaters directly or via the power supply bus branches, and the ground bus may be connected to the switches directly or via the ground bus branches. The buses and bus branches in the interconnect layer form a bus interconnection network. The switch layer and the interconnect layer may also be integrally disposed between the heating layer and the base 10, which can also achieve the objectives of the present disclosure. The interconnect layer may also be disposed between the heating layer and the switch layer, or disposed beneath the switch layer, or disposed above the heating layer.

The latch layer 52 is optionally disposed above the facilitate plate 20 but under the base 10. Because the latch layer 52 is disposed proximal to the base 10, it can be sufficiently cooled by the cooler, thereby guaranteeing that the latches operate in a stable temperature space; besides, even a latch in the latch layer 52 fails, the fixing device between the facility plate and the base may be disassembled to remove the failed latch out of the latch layer 52 for repair or replacement, and then the latch layer can recover operation. In alternative embodiments, the latch layer 52 may be disposed above the base or integrated in the base, and upon disassembling the latch layer 52, the failed latch may be removed from above the base and then replaced.

The latches in the present disclosure may read the contents of the control signal and determine whether it is needed to modify the output driving signal, and in cases of need, modify the driving signal. Any driver that can perform such functions may be applied to the design contemplated by the present disclosure. Besides the latches or latch circuit, the driver can also be other types of signal processing circuits, such as CPU, memory, comparator, or a combination of other electronics.

Following the same principle, the present disclosure further provides another embodiment, wherein the switch layer 51 may be disposed between the base 10 and the facility plate 20; as such, the driving wires of the large number of latches in the latch layer are connected to the driving ends of the corresponding adjacent switches, and then the second ends of the switches are connected to the power supply bus or the ground bus; the power output wires of the switches pass through the areas in the base without the coolant channels upward to reach the bridging layer above to connect the power output wires to the corresponding foil heaters and drive the latter.

In the above embodiments of the present disclosure, the switches are all connected between the second ends of the foil heaters and the power supply bus, wherein heating power adjustment of the foil heaters is performed by switching the switch status. According to the principle of the present disclosure, the switches may be connected between the first ends of the foil heaters and the ground bus, and the second ends of the foil heaters are connected to the power supply bus. It is also a varied embodiment that the first ends of part of the foil heaters are connected to the switches and the power supply bus, and the second ends of the remaining part of the foil heaters are connected to the switches and the power supply bus.

Figure 10A:
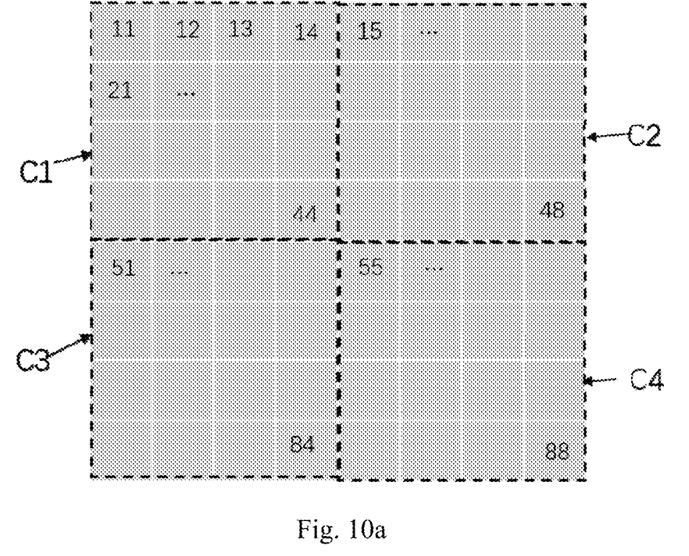
FIG. 10a and FIG. 10b are schematic diagrams of two ways to divide the multi-zone heater into two zones according to the present disclosure.

The present disclosure may simultaneously drive a very large number (e.g., over 200) of foil heaters, realizing independent temperature control of each foil heater; however, some processes might not need so much independent temperature controlled foil heaters, e.g., which might only need 10 to 20 independent temperature control units; in this case, the plurality of independent temperature controlled foil heaters may be synchronously controlled. As illustrated in FIG. 10a, the total 64 foil heaters (11~88) may be merged and controlled as individual zones, wherein the 16 foil heaters in each of C1-C4 zones are integrally controlled via four control signals. The control signals outputted by the controller 40 enable all latches in zone C1 to implement synchronous signal conversion, i.e., implementing adaptive adjustment of the heater resolution, without a need of independently designing a whole set of heater hardware with less temperature control zones, thereby significantly reducing the time and cost for research and design.

Figure 10B:
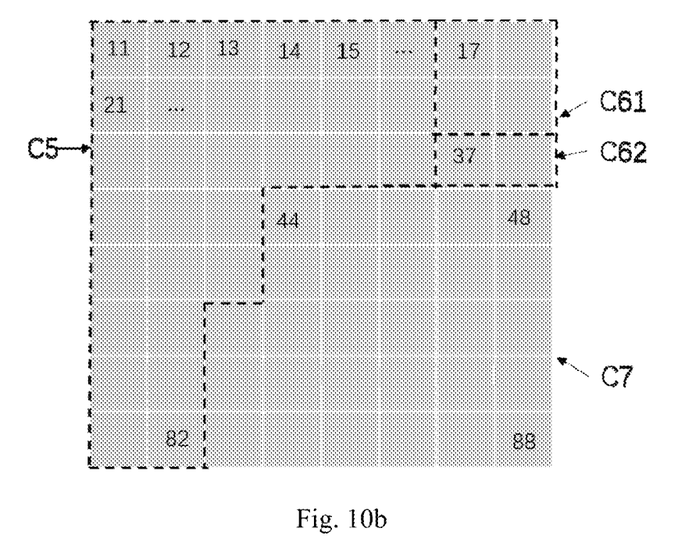

Besides, the temperature detector which is critical to temperature control is also key to multi-zone temperature control. It is hardly implemented to embed the number of detectors equivalent to the number of foil heaters in the electrostatic chuck or heater. Therefore, it is also a key technical challenge to reduce the number of temperature sensors while effectively measuring the temperature of the to-be-processed wafer above the electrostatic chuck. The drive control structure of the present disclosure facilitates resolution to this technical problem. By conducting sufficient testing before production of the products, temperature distribution maps under different hardware settings may be achieved; in the flat temperature control zone where temperature variation is small, the temperatures of the entire zone can be calculated by only arranging a few (3-5) temperature sensors, while for regions with a drastic temperature variation, more temperature sensors may be arranged with a high density. In this way, the temperature distribution variation of the whole electrostatic chuck can be monitored. In the present disclosure, the zones divided as per the heaters may conveniently implement positional correspondence with respect to the flat temperature control zones and drastic temperature control zones by software setting, e.g., in FIG. 10b, the zones corresponding to C61, C62 correspond to the temperature control zones with large temperature variations, where there only include a few independent foil heaters (2 and 4, respectively); the shapes of C5 and C7 correspond to the shapes of the flat temperature control zones. A large number of independent foil heaters in C5 and C7 zones synchronously have the same driving signal, thereby implementing a unified control. In this way, with less temperature sensors, fast temperature control can be implemented by unified control of a plurality of temperature-controlled heating zones. By setting different shapes of unified temperature control zones in software to so as to be adapted to different hardware structures, e.g., different layouts and shapes of coolant channels or different electrostatic chuck structures, optimal matching can be implemented through software settings, thereby significantly improving the adaptability to different hardware structures.

Various disc-shaped devices such as the heating layer, the interconnect layer, the switch layer, the bridging layer, and the latch layer may independently form a functional device, or may be integrated into one device, or may be defined by a space without including entity parts. For example, the switch layer and the bridging layer may be integrated into one piece, the heating layer and the interconnect layer may be integrated into one piece, etc., as long as the fabrication process can implement. The various functional devices above may be selectively integrated, or partially integrated while the remaining parts are discretely assembled into the plasma processing apparatus. For example, the latch layer may be independently assembled beneath the base, while the remaining devices such as the switch layer, the bridging layer, and the interconnect layer may be selectively integrated and mutually fixed with the base. After the plurality of functional plates are integrated into one part, they can still implement the above functions, but saving more space. On the other hand, the vertical position relationships of the plates may also have a plurality of options, e.g., when the latch layer and the switch layer are both disposed beneath the base, the latch layer may be disposed above the switch layer. The switch layer may also be disposed above the heater plates and the interconnect layer. Therefore, in the present disclosure, various integrations, combinations, and vertical position layout of the various functional plates can also achieve the objective of the present disclosure, all of which fall within the protection scope of the present disclosure.

The above description of the disclosed embodiments enables those skilled in the art to implement or use the present disclosure. Various modifications to these embodiments are obvious to those skilled in the art. The general principle defined herein may be implemented in other embodiments without departing from the spirit or scope of the present disclosure. Therefore, the present disclosure will not be limited to these embodiments illustrated herein, but conforms with the broadest scope consistent with the principle and novel features disclosed herein.

What is claimed is:

1. A bottom electrode assembly for a plasma processing apparatus, comprising:
a base and an electrostatic chuck, a multi-zone heating apparatus being provided between the base and the electrostatic chuck, wherein the multi-zone heating apparatus includes:
a plurality of switches, each switch being connected with a foil heater to form a heating unit; wherein two ends of a plurality of the heating units are connected with a ground bus and a power supply bus, respectively;
a plurality of driving wires, each driving wire being connected with a switch from the plurality of switches and configured to transmit a driving signal of a duty cycle of the switch, wherein the switches independently control operating time of the corresponding connected foil heater based on the driving signal,
and at least one driver, the driver transmitting the driving signal to at least one switch from the plurality of switches via the driving wire;
wherein the plurality of foil heaters forms a heating layer, the plurality of foil heaters in the heating layer being arranged in arrays, at least two foil heaters being disposed in a same horizontal plane; and the plurality of switches form a switch layer, the switch layer being disposed above or beneath the heating layer, or the switch layer and the heating layer being disposed in the same plane.

2. The bottom electrode assembly according to claim 1, wherein a coolant channel is provided in the base, the driver is disposed beneath the base, and the plurality of driving wires connected to the driver, bypassing the coolant channel and passing through the base, are connected to the plurality of switches above the base.

3. The bottom electrode assembly according to claim 1, wherein the bottom electrode assembly further comprises a control bus, wherein the control bus outputs a control signal to the at least one driver, the control signal including coordinate information and target power value information of the heating unit that requires temperature adjustment.

4. The bottom electrode assembly according to claim 1, wherein the driver is configured to identify a control signal of the control bus and transmits the driving signal to a corresponding switch; and the driver includes at least one of a latch, a CPU, a memory, or a comparator.

5. The bottom electrode assembly according to claim 1, wherein current flowing through the switch is less than or equal to 100 milliamperes.

6. A plasma processing apparatus, comprising:
a plasma process chamber in which the bottom electrode assembly according to claim 1 is disposed, wherein the multi-zone heating apparatus of the bottom electrode assembly is configured to perform multi-zone temperature adjustment on a wafer held by the electrostatic chuck.

7. A plasma processing apparatus, comprising:
a plasma process chamber in which a bottom electrode assembly is disposed;
the bottom electrode assembly comprising a base and an electrostatic chuck, a multi-zone heating apparatus being provided between the base and the electrostatic chuck, wherein the multi-zone heating apparatus includes: a plurality of switches, each switch being connected with a foil heater to form a heating unit wherein two ends of a plurality of the heating units are connected with a ground bus and a power supply bus, respectively; a plurality of driving wires, each driving wire being connected with a switch from the plurality of switches and configured to transmit a driving signal of a duty cycle of the switch, wherein the switches independently control operating time of the corresponding connected foil heater based on the driving signal; and at least one driver, the driver transmitting the driving signal to at least one switch from the plurality of switches via the driving wire;
wherein the multi-zone heating apparatus of the bottom electrode assembly is configured to perform multi-zone temperature adjustment on a wafer held by the electrostatic chuck;
wherein the drivers are disposed above the base, a bonding layer is provided between the base and the plurality of foil heaters, and the drivers are disposed in the bonding layer or in a recessed portion of the upper surface of the base.

8. The plasma processing apparatus according to claim 7, wherein the number of heating units of the multi-zone heating apparatus is greater than or equal to 100.

9. The plasma processing apparatus according to claim 7, wherein the driver is configured to identify and store a control signal transmitted via the control bus and determine whether to adjust a driving signal outputted by the driver based on the control signal, wherein the plurality of heating units independently perform heating power adjustment based on the driving signal.

10. The plasma processing apparatus according to claim 9, wherein the plasma processing apparatus includes a plurality of drivers, each driver being connected to one or more heating units.

11. The plasma processing apparatus according to claim 7, wherein a facility plate is further provided beneath the base, the drivers being disposed between the base and the facility plate.

12. The plasma processing apparatus according to claim 7, wherein the multi-zone heating apparatus further comprises a bridging layer, the bridging layer being disposed above the base and configured to arrange the driving wires to the plurality of switches.

13. The plasma processing apparatus according to claim 12, wherein an upper surface of the bridging layer includes output ends of a plurality of the driving wires, positions of the plurality of output ends corresponding to the switches above the base.

14. The plasma processing apparatus according to claim 7, wherein the plasma processing apparatus includes a controller, the controller being located in a non-RF hot space outside the plasma process chamber, wherein a control signal outputted by the controller is transmitted to the driver via the control bus.

15. The plasma processing apparatus according to claim 14, wherein the controller transmits an optical control signal via an optical fiber to a photoelectric conversion device in the plasma process chamber, the photoelectric conversion device outputting an electric control signal to the control bus.

16. The plasma processing apparatus according to claim 14, wherein the control bus is connected with the controller via a control bus filter.

17. The plasma processing apparatus according to claim 7, wherein the driving signal is a pulsed signal and the pulse signal enables each switch to cyclically switch between ON and OFF states, wherein heating power output of the foil heater is associated with a duty cycle of the pulsed signal.

18. The plasma processing apparatus according to claim 7, wherein a main heater is further provided between the base and the electrostatic chuck, the main heater being disposed beneath the heating layer.

19. The plasma processing apparatus according to claim 7, wherein the ground bus and the power supply bus are connected to a non-RF hot space outside the plasma process chamber via a filter, respectively.

20. The bottom electrode assembly according to claim 7, wherein the plurality of foil heaters forms a heating layer, the plurality of foil heaters in the heating layer being arranged in arrays, at least two foil heaters being disposed in a same horizontal plane; and the plurality of switches form a switch layer, the switch layer being disposed above or beneath the heating layer, or the switch layer and the heating layer being disposed in the same plane.

21. The plasma processing apparatus according to claim 7, wherein the ground bus is connected with a plurality of ground bus branches, and the power supply bus is connected with a plurality of power supply bus branches, wherein one end of each of the heating units is connected with the ground bus via one ground bus branch and the other end thereof is connected with the power supply bus via one power supply bus branch.

22. A plasma processing apparatus, comprising:
a plasma process chamber in which a bottom electrode assembly is disposed;
the bottom electrode assembly comprising a base and an electrostatic chuck, a multi-zone heating apparatus being provided between the base and the electrostatic chuck, wherein the multi-zone heating apparatus includes: a plurality of switches, each switch being connected with a foil heater to form a heating unit wherein two ends of a plurality of the heating units are connected with a ground bus and a power supply bus, respectively; a plurality of driving wires, each driving wire being connected with a switch from the plurality of switches and configured to transmit a driving signal of a duty cycle of the switch, wherein the switches independently control operating time of the corresponding connected foil heater based on the driving signal; and at least one driver, the driver transmitting the driving signal to at least one switch from the plurality of switches via the driving wire;
wherein the multi-zone heating apparatus of the bottom electrode assembly is configured to perform multi-zone temperature adjustment on a wafer held by the electrostatic chuck;
wherein the ground bus branches and the power supply bus branches form an interconnect layer, the plurality of foil heaters form a heating layer, and the plurality of switches form a switch layer, wherein the interconnect layer is disposed between the heating layer and the switch layer, or disposed beneath the switch layer, or disposed above the heating layer.

23. The plasma processing apparatus according to claim 22, wherein the interconnect layer includes a bus interconnect network, the bus interconnect network including a plurality of wires extending upwards or downwards, the wires being connected to the switches or the foil heaters, respectively.

24. A plasma processing apparatus, comprising:
 a plasma process chamber in which a bottom electrode assembly is disposed;
 the bottom electrode assembly comprising a base and an electrostatic chuck, a multi-zone heating apparatus being provided between the base and the electrostatic chuck, wherein the multi-zone heating apparatus includes: a plurality of switches, each switch being connected with a foil heater to form a heating unit wherein two ends of a plurality of the heating units are connected with a ground bus and a power supply bus, respectively; a plurality of driving wires, each driving wire being connected with a switch from the plurality of switches and configured to transmit a driving signal of a duty cycle of the switch, wherein the switches independently control operating time of the corresponding connected foil heater based on the driving signal; and at least one driver, the driver transmitting the driving signal to at least one switch from the plurality of switches via the driving wire;
 wherein the multi-zone heating apparatus of the bottom electrode assembly is configured to perform multi-zone temperature adjustment on a wafer held by the electrostatic chuck;
 wherein a modulation circuit is provided between the driver and the switch, for dividing one ON pulse of the driving signal into a plurality of mutually isolated ON pulses.

* * * * *